United States Patent [19]

Georger, Jr.

[11] Patent Number: 5,853,953
[45] Date of Patent: Dec. 29, 1998

[54] POLYMERS AND PHOTORESIST COMPOSITIONS COMPRISING SAME

[75] Inventor: Jacque H. Georger, Jr., Holden, Mass.

[73] Assignee: Shipley Company, L.L.C., Marlborough, Mass.

[21] Appl. No.: 706,646

[22] Filed: Sep. 6, 1996

[51] Int. Cl.[6] .............................. G03F 7/004; G03F 7/023
[52] U.S. Cl. ...................... 430/270.1; 430/190; 430/192; 430/905
[58] Field of Search ..................................... 430/190, 192, 430/270.1, 905

[56] References Cited

U.S. PATENT DOCUMENTS

| | | | |
|---|---|---|---|
| 4,828,958 | 5/1989 | Hayase et al. | 430/270.1 |
| 5,177,172 | 1/1993 | Toukhy | 430/192 |
| 5,437,952 | 8/1995 | Hirai et al. | 430/192 |
| 5,514,520 | 5/1996 | Thackeray et al. | 430/192 |
| 5,529,880 | 6/1996 | Zampini et al. | 430/190 |
| 5,541,263 | 7/1996 | Thackeray et al. | 430/270.1 |

*Primary Examiner*—John S. Chu
*Attorney, Agent, or Firm*—Robert L. Goldberg

[57] ABSTRACT

The invention provides novel polymers and photoresist compositions that comprise a photoactive component and use such polymers as a resin binder component. The polymers of the invention in general comprise at least one repeating unit that includes a moiety that has a high carbon content, and preferably is an aromatic group. Preferred polymers of the invention comprise at least one repeating unit that includes a moiety that is an extended aromatic ring, or polycyclic aromatic ring system containing 2 or more rings, preferably at least two of the rings being fused, and from about 3 to 8 ring members in each ring. Photoresists of the invention include both positive-acting and negative-acting compositions and contain a resin binder component that comprises the described polymer.

6 Claims, No Drawings

POLYMERS AND PHOTORESIST COMPOSITIONS COMPRISING SAME

BACKGROUND OF THE INVENTION

1. Field of the Invention

The present invention relates to new polymers and use of such polymers as a resin binder component for negative and positive-acting photoresist compositions.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble.

In general, photoresist compositions comprise at least a resin binder component and a photoactive agent. Photoresist compositions are described in Deforest, *Photoresist Materials and Processes*, McGraw Hill Book Company, New York, ch. 2, 1975 and by Moreau, *Semiconductor Lithography, Principles, Practices and Materials*, Plenum Press, New York, ch. 2 and 4, both incorporated herein by reference for their teaching of photoresist compositions and methods of making and using the same.

While currently available photoresists are suitable for many applications, current resists also can exhibit significant shortcomings, particularly in high performance applications such as formation of highly resolved sub-Micron and sub-half micron features.

For example, problems can arise upon etching a bared substrate surface defined by a developed resist relief image. In particular, to etch aluminum, silicon oxide and other substrates rather stringent conditions are often employed. Chlorine and fluorine-based gas etchants are frequently used and extensive localized heating often occurs during the etching sequence. As a consequence, the patterned photoresist coating on the substrate can experience shrinkage or other degradation. Such degradation can reduce resolution of the feature etched into the substrate and even render the substrate unusable for its intended purpose.

Problems also can arise with use of positive-acting chemically amplified resists. These resists utilize a deprotecting or cleavage reaction of a resin binder component to provide solubility differentials between exposed and unexposed areas. That deprotection reaction can result in cleavage of a substantial mass of the resist which in turn can cause significant shrinkage of the resist coating layer areas exposed to activating radiation. Such shrinkage can compromise resolution of the image patterned in the photoresist coating layer. See, for example, U.S. Pat. Nos. 4,968,581; 4,883,740; 4,810,613 and 4,491,628 for a discussion of resist resin binders that contain acid labile groups that undergo deprotection or cleavage reactions in the presence of photogenerated acid.

Another problem has been encountered when a strong developer is used to develop photoresists, particularly negative resists. Specifically, microbridging can occur between developed images, i.e. a series of fine tendrils or strands of unremoved photoresist that pass between adjacent photoresist features in a developed photoresist coating. Using a tetramethyl ammonium hydroxide (TMAH) developer for purposes of illustration, microbridging is encountered as the developer strength exceeds 0.20N TMAH. However, for best results with negative resists, TMAH developers are desirably used at a strength of about 0.26N TMAH. As a consequence of microbridging, the useable strength of TMAH developer has been limited to about 0.15N TMAH. That reduction in the strength of the TMAH developer has resulted in a sacrifice in image resolution, clean development and development time.

In U.S. Pat. No. 5,514,520 highly useful photoresist compositions are disclosed which at least essentially eliminate microbridging. That patent discloses inter alia photoresist compositions that contain a resin having ring substituted hydroxyl groups where a portion of the hydroxyl groups are blocked with an "inert" blocking group, i.e. a group that is chemically unreactive in the presence of acid or base generated during exposure and baking of the photoresist composition.

SUMMARY OF THE INVENTION

The present invention provides novel polymers and photoresist compositions that comprise a photoactive component and such polymers as a resin binder component. The polymers of the invention in general comprise at least one repeating unit that includes a moiety that has a high carbon content, and preferably is an aromatic group. Preferred polymers of the invention comprise at least one repeating unit that contains a moiety that is an extended aromatic ring, or is a polycyclic aromatic ring system containing 2, 3, 4 or more rings, preferably at least two of the rings being fused, and from about 3 to 8 ring members in each ring.

Photoresists of the invention include both positive-acting and negative-acting compositions and contain a resin binder component that comprises the described polymer. Chemically-amplified resists are generally preferred, including negative photoresists which undergo a photoactivated crosslinking reaction to render exposed regions of a resist coating layer less developer soluble than unexposed regions, as well as positive resists which undergo a photoactivated deprotection reaction of one or more composition components to render exposed regions of a resist coating layer more soluble in an aqueous developer than unexposed regions.

Polymers of the invention used as photoresist resin binder components can exhibit improved resistance to aggressive etching environments such as chlorine or fluorine-based etchants. Moreover, polymers of the invention used as a negative photoresist resin binder have the capability to significantly reduce or even essentially eliminate microbridging as may occur with a strongly alkaline developer such as a TMAH solution of 0.20N or greater.

Further, polymers of the invention that contain photoacid labile units and used as a photoresist resin binder component may exhibit substantially decreased shrinkage relative to comparable compositions that do not contain units with such high carbon content moieties, e.g. resists that comprise a resin binder that contains a polymer consisting of only units of phenolic groups and acid labile groups.

The photoresists of the invention are particularly suitable for exposure with deep UV wavelengths (recognized as less than about 300 nm), including 248 nm.

The invention also provides methods for forming relief images, including methods for forming a highly resolved relief image such as a pattern of lines where each line has essentially vertical sidewalls and a line width of about 0.40 microns or less, or even about 0.25 microns or less. The invention further provides articles of manufacture comprising substrates such as a microelectronic wafer or a liquid crystal display or other flat panel display substrate having coated thereon the photoresists and relief images of the invention. Other aspects of the invention are disclosed infra.

DETAILED DESCRIPTION OF THE INVENTION

Polymers of the invention contain at least one repeating unit that has a high carbon content, and preferably that moiety is an aromatic group. Preferably, at least about 75 percent of the high carbon content repeating unit's mass is carbon, more preferably at least about 80 or even at least about 90 percent of the unit's total mass is carbon.

In many cases, the high carbon content moiety of polymers of the invention will be "inert" groups with respect to an acidic or basic photoproduct of a photoresist composition (although non-inert groups such as diazonaphthoquinones will be preferred for at least some applications, particularly positive systems). In other words, an "inert" high carbon moiety (group R in the below Formulae) means herein that the moiety is chemically unreactive in the presence of acid or base generated during exposure and post-exposure baking of the photoresist composition. See U.S. Pat. No. 5,514,520 to Thackeray et al. for a discussion of inert blocking groups.

Particularly preferred resins of the invention comprise at least one repeating unit that includes an extended aromatic ring or a polycyclic aromatic ring system containing 2, 3, 4 or more rings, preferably at least two of the rings being fused, from about 3 to 8 ring members in each ring. The term "extended" aromatic ring system refers to an aromatic group, particularly a single ring group such as phenyl, that contains one or more unsaturated ring substituents such as cyano, alkenyl, alknyl, alkanoyl, nitro, etc.

The high carbon content moiety may be incorporated into a resin in a number of ways. Moieties pendant to the resin backbone are generally preferred. For example, a poly(vinylphenol), novolak or other resin that contains hydroxyl ring substituents can be modified to contain such high carbon moieties. Polymers of the invention also may contain high carbon repeating units that are integral to the polymer backbone.

Preferred resin binders include one or more repeating units of the following Formulae IA and IB:

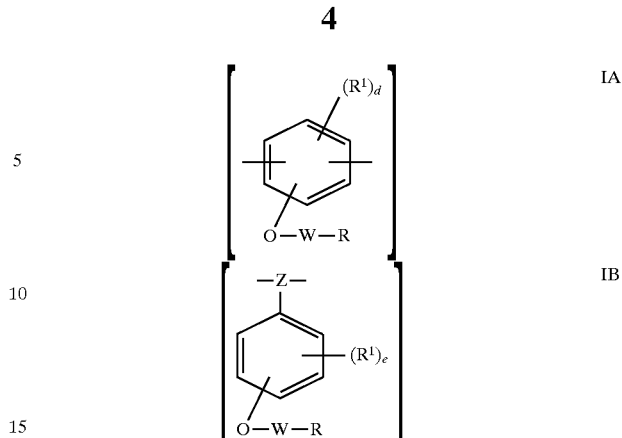

wherein in each of Formulae IA and IB W is a linker and may be e.g. a chemical bond; a substituted or unsubstituted alkylene group preferably having from 1 to about 12 carbons; a substituted or unsubstituted alkenylene preferably having from 2 to about 12 carbons; a substituted or unsubstituted alkynylene group preferably having from 2 to about 12 carbons; a substituted or unsubstituted alkanoyl preferably having from about 1 to 12 carbons, more preferably 1 to about 4 carbons such as acyl (C=O); a sulfonyl group (—S(O)$_2$); and the like.

The R group in Formulae IA and IB is either 1) a single ring aromatic group with one or more unsaturated ring substituents such as cyano; nitro; substituted or unsubstituted alkenyl having one or more unsaturated linkages and preferably from 2 to about 16 carbons, more preferably 2 to about 8 carbon atoms; substituted or unsubstituted alkynyl having one or more unsaturated linkages and preferably from 2 to about 16 carbons, more preferably 2 to about 8 carbon atoms; substituted or unsubstituted alkanoyl preferably having 1 to about 12 carbon atoms, more preferably 1 to about 8 carbons with acyl (CH$_3$C(=O)) being particularly preferred, or 2) a substituted or unsubstituted polycyclic aromatic group having from containing 2, 3, 4 or more rings, preferably at least two of the rings being fused, from about 3 to 8 ring members in each ring.

Preferred polycyclic aromatic R groups include substituted or unsubstituted naphthyl, acenaphthyl, phenanthryl and diazonaphthoquinones, including 1-oxo-2-diazonaphthoquinone-5-arylsulfonates and 1-oxo-2-diazonaphthoquinone-4-arylsulfonates such as diazonaphthoquinone-5-phenylsulfonates and 1-oxo-2-diazonaphthoquinone-4-phenylsulfonates. Substituted or unsubstituted carbocyclic aryl groups are generally preferred, although substituted or unsubstituted heterocyclic groups also will be suitable e.g. those groups having 1 to about 3N, O and/or S ring atoms such as amidazole, pyridine, pyrimidine, triazine, pyrole, thiophene, furane, tetrahydrofuranyl, tetrahydropyranal, piperdinyl and the like.

Diazonaphthoquinones are particularly preferred R groups for polymers used as resin binders components of resists imaged with deep UV radiation, particularly exposure wavelengths of 248 nm. In particular, the diazonaphthoquinones are bleachable, particularly at deep UV wavelengths such as 248 nm, i.e. groups will strongly absorb at those wavelengths and photochemically generate sulfonic or carboxylic acids. Further, such acid photogenerated from the blocking group may act as an accelerator for the resist.

Each R$^1$ group of Formulae IA and IB independently may be e.g. halogen (particularly F, Cl and Br), substituted or unsubstituted alkyl preferably having 1 to about 10 carbons, substituted or unsubstituted alkoxy preferably having 1 to about 10 carbon atoms, substituted or unsubstituted alkenyl preferably having 2 to about 10 carbon atoms, substituted or unsubstituted alkynyl preferably having 2 to about 10 carbons, substituted or unsubstituted alkylthio preferably having 1 to about 10 carbons, cyano, nitro, amino, hydroxyl, etc., or two $R^1$ groups (typically on adjacent carbons) may be taken together to form (with ring carbons to which they are attached) one, two or more fused aromatic or alicyclic rings having from 4 to about 8 ring members per ring (such as to form with the depicted phenyl a substituted or unsubstituted naphthyl or acenaphthyl ring); d is an integer of from 0 (where depicted is hydrogen substituted in each available position) to 3; e is an integer of from 0 (where depicted is hydrogen substituted in each available position) to 4; and Z is a bridge group between polymer units, e.g. an alkylene linkage having 1 to about 5 carbon atoms, more typically 1 to about 3 carbons.

Generally preferred polymers will comprise at least about 5 mole percent of units of Formulae IA or IB, more typically at least about 10 mole percent of such units.

A wide variety of other units may be present in a resin together with the above repeating unit. For example, preferred polymers of the invention include phenolic resins where a portion of the phenolic hydroxyl groups have an extended aromatic or polycyclic group. Specifically preferred polymers include those of the following Formula II:

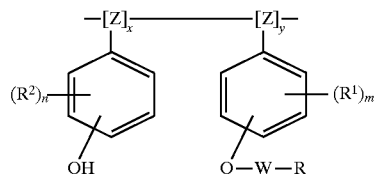

wherein in Formula II each Z, W and R is the same as specified above for Formula IA and IB, and each $R^1$ and $R^2$ group is independently the same as defined above for $R^1$, e.g. halogen (particularly F, Cl and Br), substituted or unsubstituted alkyl preferably having 1 to about 10 carbons, substituted or unsubstituted alkoxy preferably having 1 to about 10 carbon atoms, substituted or unsubstituted alkenyl preferably having 2 to about 10 carbon atoms, substituted or unsubstituted alkynyl preferably having 2 to about 10 carbons, substituted or unsubstituted alkylthio preferably having 1 to about 10 carbons, cyano, nitro, amino, hydroxyl, etc., or two $R^1$ groups (typically on adjacent carbons) or two $R^2$ groups (typically on adjacent carbons) may be taken together to form (with ring carbons to which they are attached) one, two or more fused aromatic or alicyclic rings having from 4 to about 8 ring members per ring (such as to form with the depicted phenyl a substituted or unsubstituted naphthyl or acenaphthyl ring); m and n each is independently an integer of from 0 (where each phenyl ring is fully hydrogen-substituted) to 4, and preferably is 0, 1 or 2; x and y are mole fractions or percents of the respective units of the polymer. Preferably, x and y each will be within the range of from about 5 to 90 mole percent.

Also, a polymer of Formula II may comprise a mixture of different units with differing $R^1$ groups or $R^2$ groups, or no $R^1$ groups (i.e. m=0) or no $R^2$ groups (i.e. n=0).

One preferred class of polymers of the invention contains both phenolic and non-aromatic cyclic alcohol units with a high carbon content moiety pendant to phenolic or nonaromatic cyclic alcohol groups. Polymers containing such phenolic and non-aromatic cyclic alcohol units are disclosed in U.S. Pat. Nos. 5,340,696 and 5,128,232, both to Thackeray et al.

Specifically preferred polymers of the invention of this type have a structure corresponding to the following Formula III:

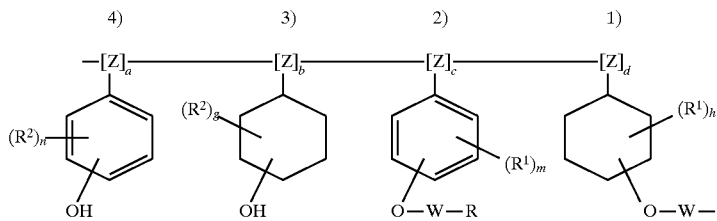

wherein in Formula III each Z, W, R, $R^1$, $R^2$, m and n is the same as defined above for Formula II; g and h are each an integer from 0 to 9; and a, b, c and d are the mole fractions of the respective units of the polymer. In Formula III, non-aromatic cyclic alcohol units 1) and 3) as depicted are intended to optionally include one or two endocyclic carbon-carbon double bonds. Each of the mole percent values a, b, c and d may suitably vary within a wide range, e.g. from about 5 to about 85 or 90 percent. Preferably the sum of a and c is about 50 mole percent or greater.

A further preferred class of polymers of the invention includes a repeating unit that undergoes photoacid-induced cleavage when used as a resin binder component for a chemically-amplified photoresists. A wide variety of acid labile groups have been reported and can be incorporated into polymers of the invention. See, for example, the above-mentioned U.S. Pat. Nos. 4,968,581; 4,883,740; 4,810,613 and 4,491,628 as well as U.S. Pat. No. 5,258,257 to Sinta et al. for a discussion of acid labile groups. Generally preferred acid labile groups are pendant to the polymer backbone. Acrylate groups are particularly preferred. The pendant substituted moiety of the acrylate unit, i.e. a moiety of the formula $R^3$—O—C(=O)—, serves as the acid labile group. A wide variety of acrylate units may be employed including those having an ester group (group $R^3$ above) that is a substituted or unsubstituted non-cyclic or cyclic alkyl or carbocyclic aryl preferably having 1 to about 20 carbon atoms, more typically 1 to about 15 carbons such as substituted and unsubstituted methyl, ethyl, propyl, butyl including t-butyl, hexyl including cyclohexyl, adamantyl, norbornyl, isobornyl, phenyl, etc. Also suitable will be such alkyl ester groups that have one or more substituents such as halogen, particularly F, Cl or Br, $C_{1-6}$ alkoxy, aryl such as phenyl, etc. Other preferred acid labile groups include acetate and oxycarbonyl groups that are pendant to a phenolic unit. See U.S. Pat. No. 5,258,257 to Sinta et al.

Specifically preferred polymers of the invention of this type have a structure corresponding to the following Formula IV:

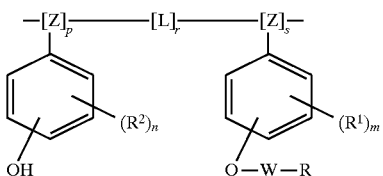

wherein in Formula IV each Z, W, R, $R^1$, $R^2$, m and n is the same as defined above for Formula II; L is a unit that contains an acid labile group; and p, r and s are the mole fractions of the respective units. Each of the mole percent values p, r and s may suitably vary within a wide range. Again, preferred L groups include acrylate groups, such as those described above, although a wide variety of acid labile groups will be suitable include the groups discussed in the above-mentioned patents such as oxycarbonyl and oxyacetate groups, e.g. pendant groups of the formula —$C_6H_5OC$(=O)$OR^3$ or —$C_6H_5OCH_2C$(=O)$OR^3$ where $R^3$ is substituted or substituted alkyl or aryl such as t-butyl, phenyl, benzyl and the like. Such groups are described in U.S. Pat. No. 5,258,257 to Sinta et al. Preferably the mole percent p is from about 0 to 90 percent, more preferably 10 to about 90 percent; the mole percent r is from about 1 to 75 percent, more preferably about 2 to 60 percent; and the mole percent s is from about 1 to about 75 percent, more preferably about 2 to 60 percent.

Also, in each of Formulae II, III and IV, the depicted hydroxyl ring substituent may be either at the ortho, meta or para positions throughout the polymer (2, 3 or 4 positions with respect to the non-aromatic cyclic alcohol units 1 and 3) of Formula III). Para or meta substitution is generally preferred.

The above-mentioned substituted groups (including substituted groups Z, W, R, $R^1$, $R^2$ and $R^3$ moieties) may be substituted at one or more available positions by one or more suitable groups such as halogen (particularly F, Cl or Br); $C_{1-2}$ alkyl; $C_{1-12}$ alkoxy; $C_{2-12}$ alkenyl; $C_{2-12}$ alkynyl; aryl such as phenyl; alkanoyl, e.g. a $C_{1-12}$ alkanoyl such as acyl; nitro; cyano; and the like. Typically a substituted moiety is substituted at one, two or three available positions.

Preferred polymers of Formulae II through IV include those where the only polymer units correspond to the general structures depicted in those Formulae, i.e. in the case of Formula II where the sum of x and y is about 100 percent; in the case of Formula III where the sum of a, b, c and d is about 100 percent; and in the case of Formula IV where the sum of p, r and s is about 100 percent.

However, preferred polymers also may comprise additional units wherein the sum of such mole fractions would be less than one hundred. For example, a polymer may comprise condensed substituted or unsubstituted styrene or other vinyl aryl units. In Formula II, preferably the sum of x and y will be at least about 50 percent, more preferably at least about 70 or 80 percent. In Formula III, preferably the sum of a, b, c and d will be at least about 50 percent, more preferably at least about 70 or 80 percent. Similarly, with respect to Formula IV, preferably the sum of p, r and s will be at least about 50 percent, more preferably at least about 70 or 80 percent.

Polymers of the invention can be prepared by a variety of methods. One suitable method is free radical polymerization, e.g., by reaction of a plurality of monomers to provide the various units as discussed above in the presence of a radical initiator under an inert atmosphere (e.g., $N_2$ or argon) and at elevated temperatures such as about 70° C. or greater, although reaction temperatures may vary depending on the reactivity of the particular reagents employed and the boiling point of the reaction solvent (if a solvent is employed). Suitable reaction temperatures for any particular system can be readily determined empirically by those skilled in the art based on the present disclosure. A reaction solvent may be employed if desired. Suitable solvents include alcohols such as propanols and butanols and aromatic solvents such as benzene, chlorobenzene, toluene and xylene. Dimethylsulfoxide and dimethylformamide are also suitable. The polymerization reaction also may be run neat. A variety of free radical initiators may be employed to prepare the polymers of the invention. For example, azo compounds may be employed such as azo-bis-2,2'-isobutyronitrile (AIBN) and 1,1'-azobis(cyclohexanecarbonitrile). Peroxides, peresters, peracids and persulfates also can be employed.

For preparation of polymers having an acrylate acid labile group (unit L in Formula IV above), monomers of one or more substituted or unsubstituted alkyl acrylates such as t-butylacrylate can be condensed with other monomers to provide the desired polymer. The pendant substituted moiety of the condensed acrylate unit, i.e. R—O—C(=O)—, serves as the pendant acid labile group. As discussed above, a wide variety of acrylate units may be employed including those having an ester group that is a non-cyclic or cyclic alkyl having 1 to about 14 carbon atoms. Also suitable will be such alkyl ester groups that have one or more substituents such as halogen, particularly F, Cl or Br, $C_{1-6}$ alkoxy, aryl such as phenyl, etc. Exemplary compounds that may be condensed to provide the acrylate units of polymers of the invention include methylacrylate, ethylacrylate, methylmethacrylate, ethylmethacrylate, butylacrylate including t-butylacrylate, butylmethacrylate including t-butylmethacrylate, etc. Such monomers are commercially available or can be readily prepared by known procedures.

Acid labile groups also may be formed by condensation reaction with a preformed polymer. See U.S. Pat. No. 5,258,257 for a discussion of such an approach.

In similar manner, a preformed resin may be functionalized to provide the desired polymer of the invention with high carbon content groups. For example, a phenolic such as a novolac, a poly(vinylphenol) or a partially hydrogenated novolac or poly(vinylphenol) (i.e. a phenolic/nonaromatic cyclic alcohol copolymer) may be reacted with a compound that combines with the polymer's hydroxyl groups to form the high carbon content moiety (group -W-R in Formulae I through IV above). For example, if the high carbon content moiety is a sulfonic acid ester (i.e. where W is $S(O)_2$ in the above Formulae), a sulfonic acid halide is added to a solution of the preformed polymer in the presence of a suitable base and the mixture stirred typically with heating. A variety of bases may be employed for the condensation reaction including hydroxides such as sodium hydroxide. The condensation reaction is typically carried out in an organic solvent. A variety of organic solvents are suitable as would be apparent to those skilled in the art. Ethers such as diethyl ether and tetrahydrofuran and ketones such as methyl ethyl ketone and acetone are preferred. Suitable conditions for the condensation reaction can be determined based upon the constituents used. The percent substitution of the preformed polymer with the high carbon content moiety can be controlled by the amount of the moiety precursor (e.g., the sulfonic acid halide as discussed above) condensed with the polymer. Control of the percent substitution of a polymer also enables control of the absorbance of the polymer, i.e. if the grafted blocking group absorbs at the exposure wavelengths, then the percent substitution of the polymer will proportional to the polymer's absorbance. The percent substitution of a polymer can be readily ascertained by proton and $^{13}C$ NMR.

Preferably a polymer of the invention will have a weight average molecular weight (Mw) of 1,000 to about 100,000, more preferably about 2,000 to about 30,000 with a molecular weight distribution (Mw/Mn) of about 3 or less, more preferably a molecular weight distribution of about 2 or less. Molecular weights (either Mw or Mn) of the polymers of the invention are suitably determined by gel permeation chromatography.

As discussed above, the resins of the invention are highly useful as the resin binder component in photoresist compositions, including both negative and positive resists. Photoresists of the invention in general comprise a photoactive component and a resin binder component that comprises the above-described copolymer.

The resin binder component should be used in an amount sufficient to render a coating layer of the resist developable with an aqueous alkaline developer.

A particularly preferred class of photoresists for use in accordance with the present invention are those chemically amplified compositions that comprise the above described polymer of the invention as a resin binder, a photoacid generator and one or more other materials that will result in curing, crosslinking or hardening of the composition upon exposure to activating radiation and, typically, heating. A preferred composition is an acid-hardening photoresist that comprises a photoacid generator, a resin binder that comprises polymer(s) of the invention, and an amine-based crosslinker such as the melamine-formaldehyde Cymel resins or glycourils such as those available under the tradename of Powderlink 1174, both classes of materials available from American Cyanamid. Such acid-hardening resists are described, e.g., in European Patent Applications 0,164,248 and 0,232,972 and U.S. Pat. No. 5,128,232.

In another preferred aspect, the invention provides chemically amplified positive-acting photoresists. These resists in general comprise a photoactive component and a polymer of the invention that contains acid labile groups, such as a polymer of Formula IV above. The polymer will be used as the resist's resin binder component, and photoactivation of a coating layer of the resist results in a cleavage or other reaction of the polymer acid labile groups.

The invention also provides "conventional" positive-acting photoresists that comprise a photoactive component that serves as a dissolution rate inhibitor and a resin binder component that comprises a polymer of the invention which need not contain acid labile groups. Photoactivation of a coating layer of the resist results in conversion of the photoactive component to an acidic material, rendering regions of the coating layer containing that acidic photoproduct comparatively more soluble in an aqueous alkaline developer solution than regions that contain only the intact (non-activated) photoactive component.

As discussed, the resist compositions of the invention comprise a photoactive component, particularly a photoacid generator (i.e. "PAG") that is suitably employed in an amount sufficient to generate a latent image in a coating layer of the resist upon exposure to activating radiation.

Sulfonate compounds are generally preferred PAGs, particularly sulfonate salts. Two specifically preferred agents are the following PAGS 1 and 2:

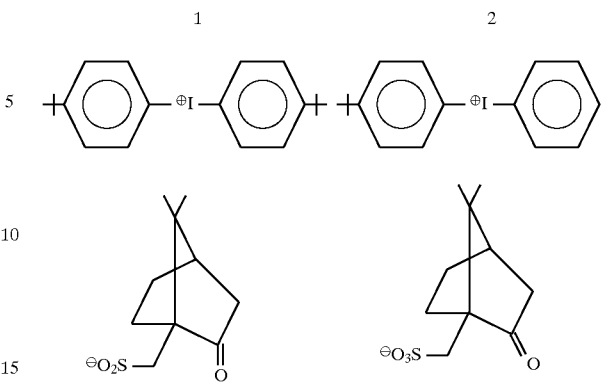

These sulfonate compound can be prepared as disclosed in Example 3 which follows, which details the synthesis of above PAG 1. Sulfonate PAG 2 above can be prepared by the same procedures of Example 3 which follows, except approximately molar equivalents of t-butyl benzene and benzene would be reacted together in the first step with acetic anhydride and $KIO_3$. Also preferred are the above two iodonium compounds with counter anions of trifluoromethylsulfonate ($CF_3SO_3$) and phenylsulfonate. These sulfonate PAGS are particularly preferred for use in the chemically-amplified positive photoresists of the invention.

Other suitable sulfonate PAGS including sulfonated esters and sulfonyloxy ketones. See *J. of Photopolymer Science and Technology*, 4(3):337–340 (1991), for disclosure of suitable sulfonate PAGS, including benzoin tosylate, t-butylphenyl alpha-(p-toluenesulfonyloxy)-acetate and t-butyl alpha-(p-toluenesulfonyloxy)-acetate. Preferred sulfonate PAGs are also disclosed in U.S. Pat. No. 5,344,742 to Sinta et al.

Onium salts are also generally preferred acid generators of compositions of the invention. Onium salts that weakly nucleophilic anions have been found to be particularly suitable. Examples of such anions are the halogen complex anions of divalent to heptavalent metals or non-metals, for example, Sb, Sn, Fe, Bi, Al, Ga, In, Ti, Zr, Sc, D, Cr, Hf, and Cu as well as B, P, and As. Examples of suitable onium salts are diaryl-diazonium salts and onium salts of group Va and B, Ia and B and I of the Periodic Table, for example, halonium salts, quaternary ammonium, phosphonium and arsonium salts, aromatic sulfonium salts and sulfoxonium salts or selenium salts. Examples of suitable preferred onium salts can be found in U.S. Pat. Nos. 4,442,197; 4,603,101; and 4,624,912.

Other useful acid generators include the family of nitrobenzyl esters, and the s-triazine derivatives. Suitable s-triazine acid generators are disclosed, for example, in U.S. Pat. No. 4,189,323.

Halogenated non-ionic, photoacid generating compounds are also suitable such as, for example, 1,1-bis[p-chlorophenyl]-2,2,2-trichloroethane (DDT); 1,1-bis[p-methoxyphenyl]-2,2,2-trichloroethane; 1,2,5,6,9,10-hexabromocyclodecane; 1,10-dibromodecane; 1,1-bis[p-chlorophenyl]-2,2-dichloroethane; 4,4-dichloro-2-(trichloromethyl) benzhydrol (Kelthane); hexachlorodimethyl sulfone; 2-chloro-6-(trichloromethyl) pyridine; o,o-diethyl-o-(3,5,6-trichloro-2-pyridyl) phosphorothionate; 1,2,3,4,5,6-hexachlorocyclohexane; N(1,1-bis[p-chlorophenyl]-2,2,2-trichloroethyl)acetamide; tris[2,3-dibromopropyl]isocyanurate; 2,2-bis[p-chlorophenyl]-1,1-dichloroethylene; tris[trichloromethyl]s-triazine; and their isomers, analogs, homologs, and residual compounds. Suitable photoacid generators are also disclosed in European Patent Application Nos. 0164248 and 0232972. Acid generators that are particularly preferred for deep U.V. exposure include 1,1-bis(p-chlorophenyl)-2,2,2-trichloroethane (DDT); 1,1-bis(p-methoxyphenol)-2,2,2-trichloroethane; 1,1-bis(chlorophenyl)-2,2,2 trichloroethanol; tris(1,2,3-methanesulfonyl)benzene; and tris (trichloromethyl)triazine.

The polymers of the invention also may be used as a resin binder component in negative base-hardening photoresist compositions, i.e. compositions that contain a photobase generator compound and undergo a base-promoted crosslinking reaction upon exposure to activating radiation. Suitable photobase generator compounds and the use of base-hardening compositions are disclosed in U.S. Pat. No. 5,262,280 to Knudsen et al. Amine-based crosslinkers such as the above-discussed melamine resins are suitable for the base-hardening compositions.

A preferred optional component of resist compositions of the invention is a dye compound. Preferred dyes can enhance resolution of the patterned resist image, typically by reducing reflections and the effects thereof (e.g. notching) of the exposure radiation. Preferred dyes include substituted and unsubstituted phenothiazine, phenoxazine, anthracene and anthrarobin compounds. Preferred substituents of substituted phenothiazine, phenoxazine, anthracene and anthrarobin include e.g. halogen, $C_{1-12}$ alkyl, $C_{1-12}$ alkoxy, $C_{2-12}$ alkenyl, $C_{1-12}$ alkanoyl such as acetyl, aryl such as phenyl, etc. Copolymers of such compounds also may be used as a dye, e.g., an anthracene acrylate polymer or copolymer. A curcumin dye also may be used for some applications. Rather than a separate composition component, such dyes also can be incorporated directly into a polymer of the invention, e.g. where two adjacent $R^1$ or $R^2$ moieties (as defined in Formulae II through IV above) together form a fused ring to provide an acenaphthyl group, diazonaphthoquinone moiety (including a 1-oxo-2-diazonaphthoquinone-5-arylsulfonate or 1-oxo-2-diazonaphthoquinone-4-arylsulfonates) or the like. In addition to reducing reflections in deep U.V. exposures, use of a dye may expand the spectral response of the compositions of invention including beyond 248 nm or other deep UV wavelengths, such as to 365 nm or 436 nm exposure wavelengths.

Another preferred optional additive is an added base, particularly tetrabutylammonium hydroxide (TBAH), or the lactate salt of TBAH, which can enhance resolution of a developed resist relief image. The added base is suitably used in relatively small amounts, e.g. about 1 to 20 percent by weight relative to the photoactive component (PAG).

Photoresists of the invention also may contain other optional materials. For example, other optional additives include anti-striation agents, plasticizers, speed enhancers, etc. Such optional additives typically will be present in minor concentration in a photoresist composition except for fillers and dyes which may be present in relatively large concentrations such as, e.g., in amounts of from about 5 to 30 percent by weight of the total weight of a resist's dry components.

The compositions of the invention can be readily prepared by those skilled in the art. For example, a photoresist composition of the invention can be prepared by dissolving the components of the photoresist in a suitable solvent such as, for example, ethyl lactate, a glycol ether such as 2-methoxyethyl ether (diglyme), ethylene glycol monomethyl ether, ethylene glycol monomethyl ether, propylene glycol monomethyl ether; a Cellosolve ester such as methyl ethyl ketone; and 3-ethoxy ethyl propionate. Typically, the solids content of the composition varies between about 5 and 35 percent by weight of the total weight of the photoresist composition. The resin binder and PAG components should be present in amounts sufficient to provide a film coating layer and formation of good quality latent and relief images. In general, components of the photoresists of the invention are present in conventional amounts. See Example 2 which follows for exemplary preferred amounts of resist components. U.S. Pat. No. 5,258,257 to Sinta et al. discloses suitable components amounts and processing for positive chemically-amplified resists.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon or silicon dioxide wafers for the production of microprocessors and other integrated circuit components. Aluminum-aluminum oxide, gallium arsenide, ceramic, quartz or copper substrates also may be employed. Substrates used for liquid crystal display and other flat panel display applications are also suitably employed, e.g. glass substrates, indium tin oxide coated substrates and the like.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 300 mJ/cm$^2$, dependent upon the exposure tool and the components of the photoresist composition.

Coating layers of the resist compositions of the invention are preferably photoactivated by an exposure wavelength in the deep U.V. range i.e., 350 nm or less, more typically in the range of about 300 nm or less, typically about 150 to 300 or 450 nm. A particularly preferred exposure wavelength is about 248 nm.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as an inorganic alkali exemplified by sodium hydroxide, potassium hydroxide, sodium carbonate, sodium bicarbonate, sodium silicate, sodium metasilicate; quaternary ammonium hydroxide solutions such as a tetra-alkyl ammonium hydroxide solution; various amine solutions such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with art recognized procedures, except that the developer strength can be higher using polymers of the invention as a resin binder component compared to prior resin binder components, particularly in the case of negative resists. Typically, the developer strength can exceed 0.2N TMAH and can be as high as 0.3N TMAH with 0.26N TMAH being generally preferred.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a chlorine or fluorine-based etchant such as a $CF_4$ or $CF_4/CHF_3$ etchant applied as a plasma stream. After such processing, resist may be removed from the processed substrate using known stripping procedures.

As discussed above, the compositions of the invention have the capability to be highly resistant to such etchants thereby enabling manufacture of highly resolved features, including lines with submicron widths. In particular, the high carbon content of the resin binders of the resists of the invention, as imparted by the resin's extended aromatic group or polycyclic aromatic ring system, will increase the percent carbon content of the polymer and in turn the resist's etch resistance. Experimental studies on selected resists have shown that an increase in the carbon content of a resist's resin binder provides a direct increase in a resist's etch resistance to strong etchants such as $CF_4$ or $CF_4/CHF_3$ etchants as measured by the amount of loss of the resist relief image during an etching process.

All documents mentioned herein are fully incorporated herein by reference. The following non-limiting examples are illustrative of the invention.

EXAMPLE 1

Preparation of Polymers

Polymers of the invention are suitably prepared in accordance with the following procedure.

Dissolve 10% hydrogenated poly(vinylphenol) in acetone (20% solids and transfer to a 3 neck round bottom flask with a mechanical stirrer, thermometer and $N_2$ inlet. Add an 11% molar equivalent of triethylamine. Add a 10% molar equivalent (with respect to the polymer) of toluene sulfonyl chloride. The reaction mixture is stirred for 3 hours at room temperature. The slightly viscous material is filtered and rinsed with acetone. The filtrate is precipitated into aqueous 1% HCl (about 1:5 volume:volume). The white solids are filtered and washed with water. The solids are reslurried in half the volume of water used for the precipitation filter and washed with water. The solids are then air-dried overnight and then dried in vacuum over for 40 hours at 100° C. The percent substitution on the hydroxyl sites of the polymer binder can be readily ascertained by proton or $^{13}C$ NMR.

Polymers of the invention may be prepared by that procedure with substitution of the appropriate compound to provide the desired pendant moiety (e.g., group R in Formulae IA and IB above). For example, to prepare cyanophenylsulfonyl-substituted or naphthylsulfonyl-substituted resins (group R in Formula I being $NCC_6H_4SO_2$— or naphthyl$SO_2O$—), cyanophenylsulfonyl chloride and naphthylsulfonylsulfonyl chloride may be substituted for the tosyl chloride in the above procedure. To prepare polymers having pendant acyl naphthyl groups (R being naphthylC(=O)— in Formulae IA and IB above), naphthyl acylchloride can be condensed with a phenolic polymer under the general procedure above. Also, any of a variety of phenolic polymers, including poly(vinylphenols) and novolacs, may be substituted for the partially hydrogenated poly(vinylphenol) described above.

EXAMPLE 2

Resist Formulations

A preferred negative photoresist of the invention is prepared by mixing the following components with the amounts expressed as weight percent of resist solution.

| Component | Amount |
|---|---|
| Solvent<br>Ethyl lactate | 83.627 |
| Resin binder<br>Poly(vinylphenol) that has 5000 Mw;<br>MW distribution of 2.0; 10% hydrogenation;<br>blocked with 10% $NCC_6H_4SO_2$ groups | 14.912 |
| Crosslinker<br>Modified glycoluril resin sold under the<br>name of Powderlink 1174 by American<br>Cyanamid Co. | 1.193 |
| Photoacid generator<br>Triphenyl sulfonium triflate<br>$(C_6H_5)_3{}^+\text{-}OSO_2CF_3$ | 0.224 |
| Surfactant<br>Polymethylsiloxane sold under the name<br>Silwet L-7604 by Union Carbide Co. | 0.033 |
| Basic Additive<br>Tetrabutylammonium hydroxide | 0.011 |

This resist can be processed in procedures as described in U.S. Pat. No. 5,514,520 to Thackeray et al. Specifically, the resist is spin-coated onto bare silicon wafers (vapor-primed with HMDS) and then softbaked at 90° C. for 60 seconds on a vacuum hotplate. The resist coating layer is exposed through a phototool and then post-exposure baked at about 110° C. for 90 seconds. The exposed resist layer is developed with a tetramethylammonium hydroxide aqueous solution such as MF CD-26 (0.26N).

EXAMPLE 3

The PAG 1 above, (di-(4-t-butylphenyl)iodonium (+/−)-10-camphor sulfonate, can be prepared as follows. A 2 L 3 neck round bottom flask was charged with potassium iodate (214.00 g, 1.00 mol), t-butylbenzene (268.44 g, 2.00 mol) and acetic anhydride (408.36 g, 4.00 mol). The flask was fitted with an efficient overhead paddle stirrer, a thermometer and a pressure equalizing dropping funnel fitted with a $N_2$ bubbler. The reaction mixture was cooled to 10° C. in a ice-water bath and concentrated sulfuric acid (215.78 g, 2.20 mol) added dropwise via the addition funnel. The addition was carried out at such a rate as to maintain the reaction temperature around 25° C. and required 2 hours. As the addition proceeded the starting white suspension became orange-yellow in color. Once the addition was over, the reaction mixture was stirred at room temperature (20° C.) for an additional 22 hours. The reaction mixture was cooled to 5°–10° C. and water (600 ml) was added dropwise over a period of 30 minutes, maintaining the temperature below 30° C. (Note the first @75 ml should be added at a particular slow rate as to control the initial exotherm, thereafter the rest of the water may be added at a faster rate). This cloudy mixture was washed with hexane (3×100 ml) (to remove unreacted t-butylbenzene and some 4-t-butyliodobenzene byproduct) in a 2 L separating funnel and the aqueous solution of diaryliodonium hydrogensulfate transferred to a 3 L reaction vessel. The solution was cooled to 5°–10° C., (+/−)-10-camphorsulfonic acid (232.30 g, 1.00 mol) was added in one portion with stirring and the solution was then neutralized with ammonium hydroxide (620 ml, 9.20 mol). The amount of base used was the theoretical amount required to neutralize all acidic species in the pot, assuming quantitative reaction. The addition of the base is carried out at such a rate as to keep the temperature below 25° C. and takes about 1 hour. As the addition nears completion and the pH of the reaction mixture approaches 7, the crude diaryliodonium camphorsulfonate precipitated as a tan solid. This suspension was allowed to stir at room temperature for 3 hours and the material isolated as follows: The tan solid was collected by suction filtration and while still moist taken up in dichloromethane (1 L) and washed with dilute ammonium hydroxide (2.5 wt %, 5 ml 14.8N NH$_4$OH+195 ml H$_2$O) until the washings are in the pH 7–8 range (1×200 ml) and then water (2×200 ml) to restore the pH to around 7. After drying (MgSO$_4$), the dichloromethane was removed under reduced pressure and the residue further dried in vacuo at 50° C. for 16 hours to give the crude product as a tan solid (390.56 g). The resulting tan solid was then purified by recrystallization in the following manner. The tan solid was dissolved in the minimum amount of refluxing isopropanol (@ 375 g PAG in @ 1150 ml IPA) in a 2 L round bottom flask to give a homogeneous dark red solution. The hot solution was transferred to a 2 L conical flask and allowed to cool. While this solution was still warm, hexane (500 ml) was added and crystals formed soon after. The crystallizing mixture was allowed to cool to room temperature and stored for 4 hours. The crystallizing solution was cooled to @ 5° C. in an ice-water bath for 1.5 hours and then the solid was collected by suction filtration and washed until white with very cold isopropanol-hexane (1:3, 2×200 ml, prepared by cooling the solvent mixture in a dry ice-acetone bath before use). The white solid was dried under aspirator vacuum for 1 hour until the PAG (di-(4-t-butylphenyl)iodonium (+/−)-10-camphor sulfonate) was isolated as a free flowing white powder. At this stage about 285 g of PAG is obtained. A second recrystallization can be performed in a similar manner.

The foregoing description of the invention is merely illustrative thereof, and it is understood that variations and modification can be made without departing from the spirit or scope of the invention as set forth in the following claims.

What is claimed is:

1. A photoresist comprising a photoactive compound and a polymer binder, said binder having the following structure:

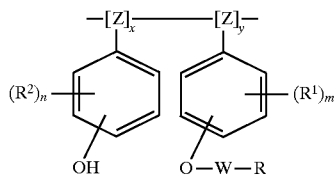

where
  W is a linker;
  each R is independently either 1) a single ring aromatic group with one or more unsaturated ring substituents, or 2) a substituted or unsubstituted polycyclic aromatic group containing 2 or more rings and from about 3 to 8 rings members in each ring;
  each Z is a bridge group; and
  each $R^1$ and $R^2$ group independently is halogen, substituted or unsubstituted alkyl, substituted or unsubstituted alkoxy, substituted or unsubstituted alkenyl, substituted or unsubstituted alkynyl, substituted or unsubstituted alkylthio, cyano, or nitro, amino or hydroxyl, or two $R^1$ groups or two $R^2$ groups may be taken together to form one or more fused aromatic or alicyclic rings having from 4 to about 8 ring members per ring; m and n each is independently an integer of from 0 to 4; and x and y are in the range of from about 5 to 90 mole percent.

2. A photoresist comprising a photoactive compound and a polymer binder having a structure of the following Formula III:

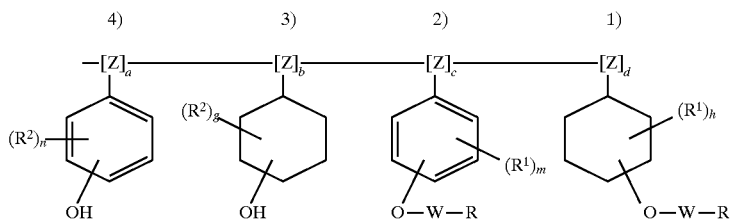

wherein
  each W is a linker;
  each R is independently either 1) a single ring aromatic group with one or more unsaturated ring substituents, or 2) a substituted or unsubstituted polycyclic aromatic group containing 2 or more rings and from about 3 to 8 ring members in each ring;
  each Z is a bridge group; and
  each $R^1$ and $R^2$ group independently is halogen, substituted or unsubstituted alkyl, substituted or unsubstituted alkoxy, substituted or unsubstituted alkenyl, substituted or unsubstituted alkynyl, substituted or unsubstituted alkylthio, cyano, or nitro, amino or hydroxyl, or two $R^1$ groups or two $R^2$ groups may be taken together to form one or more fused aromatic or alicyclic rings having from 4 to about 8 ring members per ring; m and n each is independently an integer of from 0 to 4; g and h are each independently an integer from 0 to 9; and a, b, c and d, individually vary within a range from about 5 to 90 mole percent.

3. A photoresist comprising a photoactive compound and a polymer binder having a structure of the following Formula IV:

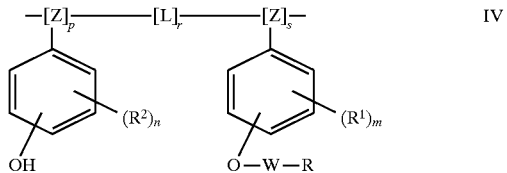

wherein
  each W is a linker;
  each R is independently either 1) a single ring aromatic group with one or more unsaturated ring substituents, or 2) a substituted or unsubstituted polycyclic aromatic group containing 2 or more rings and from about 3 to 8 ring members in each ring;

each Z is a bridge group; and each $R^1$ and $R^2$ group independently is halogen, substituted or unsubstituted alkyl, substituted or unsubstituted alkoxy, substituted or unsubstituted alkenyl, substituted or unsubstituted alkynyl, substituted or unsubstituted alkylthio, cyano, or nitro, amino or hydroxyl, or two $R^1$ groups or two $R^2$ groups may be taken together to form one or more fused aromatic or alicyclic rings having from 4 to about 8 ring members per ring;

L is a unit that contains an acid labile group;

m and n each is independently an integer of from 0 to 4; and p is from about 0 to 90 mole percent, r is from about 1 to 75 mole percent and s is from about 1 to 75 mole percent.

4. The photoresist of claim 2 wherein the photoactive component comprise a photoacid generator.

5. The photoresist of claim 2 wherein the photoresist is a negative-acting composition.

6. The photoresist of claim 2 wherein the photoresist is a positive-acting composition.

* * * * *